WALTER H. SCHROEN
JOE T. PIERCE
INVENTORS

BY Robert J. Crawford
ATTORNEY

CRYOGENIC SEMICONDUCTOR DEVICES

Filed Dec. 22, 1967 3 Sheets-Sheet 2

WALTER H. SCHROEN
JOE T. PIERCE
INVENTORS

BY Robert J Crawford
ATTORNEY

INVENTOR
WALTER H. SCHROEN
JOE T. PIERCE 3,500,137

CRYOGENIC SEMICONDUCTOR DEVICES

Walter H. Schroen, Dallas, and Joe T. Pierce, Richardson, Tex., assignors to Texas Instruments Incorporated, Dallas, Tex., a corporation of Delaware Filed Dec. 22, 1967, Ser. No. 692,906
Int. Cl. H01l *1/00*; H03k *3/38*
U.S. Cl. 317—235 5 Claims

ABSTRACT OF THE DISCLOSURE

Disclosed are cryogenic electronic devices comprising superconductive semiconductor material analogous in operation to field effect transistors. Both depletion mode and enhancement mode operation are described. Preferred materials include the lead salts, more particularly the sulfides, selenides, and tellurides of lead.

This invention relates to cryogenic electronic devices, and more particularly to cryogenic electronic devices comprising superconductive semiconductor material and analogous in operation to field effect transistors.

For purposes of this application, a material which has the capability of exhibiting superconductivity is referred to as superconductive. When a supercurrent is flowing in such a material, the material is said to be superconducting.

Conventional transistors are termed bipolar because both positive and negative charge carriers take part in the functioning of the device. On the other hand, in unipolar transistors the current is carried only by the quasi-free majority carriers in the conducting channel and no essential role is played by the small number of minority carriers.

The field-effect transistor is a type of unipolar device in which the number of carriers available to carry current in the conducting region or "channel" is controlled by the application of an electric field to the surface (or junction interface) of the semiconductor. In the field-effect transistor, electrons or holes flow from a "source" comprising an ohmic contact, through a conducting channel of semiconductor material to a "drain," also comprising an ohmic contact. The conductivity of the channel can be influenced by the charge on a "gate" having either of two forms. In the insulated gate transistor, with which type this invention is primarily concerned, the gate is one electrode of a capacitor which is separated by a thin insulator from the channel which forms the other electrode of the capacitor. This type of field effect transistor is conventionally known as MIS-FET (Metal-Insulator-Semiconductor-Field Effect Transistor). In the second type—the junction type gate transistor—the gate is a layer of semiconductor material of a conductivity type opposite to that of the channel. The junction gate is reverse biased with respect to the channel, forming an insulating depletion layer which encroaches upon the conducting channel, effectively limiting its dimension. In the use of both types, at a particular voltage called the pinch-off voltage, the channel conductance is reduced to zero, at least in the ideal case.

In the device of the present invention, the conducting region or channel is a superconductive semiconductor, and transistor functions are performed at cryogenic temperatures. The invention is further characterized by a first gate which is provided to apply an electric field to the channel to either deplete or enhance the conducting region. For operation in the depletion mode, the semiconductor material is doped so that it is superconducting when a potential is applied between source and drain. A voltage bias applied to the first gate depletes the channel of carriers and can switch the channel into the normal conducting state. For operation in the enhancement mode, the semiconductor material is doped so that it is not superconducting when a potential is applied between source and drain. However, when an appropriate bias is applied to the gate, a superconducting channel is formed between source and drain. The possibility of a transition of semiconductors to the superconducting state under the influence of an electric field was first mentioned by Sandomirskii in the JETP Lett. vol. 2, pages 248–249 (October 1965). He predicted that a surface layer of a semiconductor which would be normal at a given temperature in the absence of an electric field can be transformed into the superconductive state by the application of an electric field.

The device of the invention is further characterized by a second gate. While the second gate can be operated in the same manner as the first gate, it can also be used to apply a magnetic field to the channel in order to switch the superconducting region to the normal resistive state. The provision of a second gate permits functions not possible with conventional field effect transistors, since in the present invention the electric field dependent operation of the FET is combined with the magnetic field dependent operations of the conventional cryotron. By way of example, if the conducting region of the superconductive semiconductor is nearly depleted by a bias applied to the first gate electrode, the channel can easily be switched normal by the magentic field generated by a small current flowing in the second gate. This magnetic field switching action may be better understood in terms of the influence exerted on vortices in the superconducting semiconductor by a supercurrent flowing through a gate. Vortices are ring-shaped supercurrents of high density which surround a tiny cylinder of normal material that passes magnetic flux through the superconductor. Variations of an applied magnetic field can make vortices appear, move and disappear. Any pattern of flux and currents in a superconducting film can be represented by the appropriate vortex distribution.

In the new cryogenic field effect devices of the invention, the motion of the vortices in the superconducting semiconductor channel is controlled by the magnetic field generated by supercurrent flowing through a second gate adjacent the channel. Because of a phenomenon analogous to the tendency of rotating bodies to move sideways when immersed in a moving fluid, known as the Magnus effect, the vortices will be deflected by the magnetic field of the second gate in a direction perpendicular to the field and current directions. A voltage drop, due to differences in carrier concentration—not ohmic—will appear between source and drain. Switching action is obtained by controlling the penetration of the magnetic field into the superconducting channel. In this case, the vortices, as magnetic monopoles influenced by a magnetic field, are analogous to electric charges influenced by an electric field. Consequently, the devices of this invention combine the effects of an electric field on electric charges and of a magnetic field on magnetic monopoles.

Accordingly, it is an object of the invention to provide a superconductive semiconductor device comprising a channel of superconductive semiconductor material, source and drain electrodes and first and second gate electrodes.

A further object of the invention is to utilize the effect of an electrical bias applied to a semiconductor doped to exhibit superconductivity and the effect of a magnetic field upon said semiconductor.

Other objects, features and advantages of the invention will be more readily understood from the following detailed description when read in conjunction with the appended claims and attached drawings wherein:

The devices of the invention are operated at a temperature below the transition temperature of the superconductive material used. Accordingly, in order for the devices to operate they generally must be contained in a cryogenic refrigerator of some kind. However, since this type of apparatus is well known in the art, it has not been illustrated, and in the following detailed description of the operation of the devices of the invention, it is assumed that the device is in such a low temperature environment that superconductivity is possible.

Figure 1:
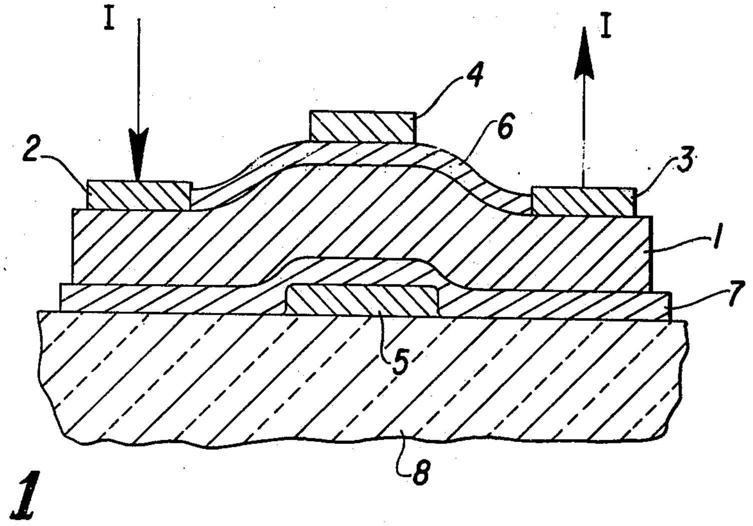
FIGURE 1 illustrates a basic structure for a device of the invention.

Referring now to the figures of the drawing in detail, FIGURE 1 shows a basic structure for the device of the invention. On a suitable supporting dielectric substrate are disposed in the indicated relation to one another and to the substrate the semiconductor material, the source and drain electrodes, the two gates, and suitable insulative material to separate the semiconductor material from the two gates. Thus, as shown in FIGURE 1, the device comprises a layer of superconductive semiconductor material 1 such as lead telluride, for example, connecting metallic source electrode 2 and drain electrode 3, a first gate electrode 4 overlying the layer of superconductive semiconductor material and in spaced relation to the source and drain electrodes, and a second gate electrode 5 opposite the first gate electrode beneath the layer of superconductive semiconductor material. The gate electrodes 4 and 5 are respectively separated from the superconductive semiconductor material 1 by layers 6 and 7 of electrical insulation, the whole structure resting upon a dielectric substrate such as glass 8.

The device may be operated in two alternative modes: the depletion mode and the enhancement mode. In the depletion mode, the conductance of the channel is high initially, due to the material being of high conductivity. The gate is then biased so as to deplete the conductance of the channel. In the enhancement mode, on the other hand, the gate voltage is such that an inversion layer is formed which represents a conducting channel underneath the gate, which channel conductively connects the source and drain.

Figure 2:
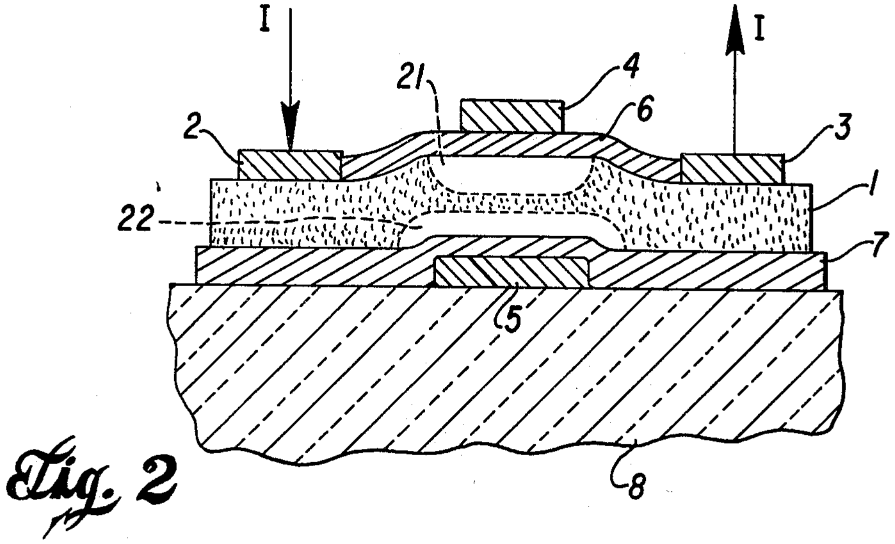
FIGURE 2 depicts the depletion mode of operation for the device illustrated in FIGURE 1.

For operation in the depletion mode, reference is made to FIGURE 2. The semiconductor material 1 is doped at a concentration of carriers such that it is superconducting when a potential is applied between source 2 and drain 3 without a bias on either gate 4 or 5. Voltage applied to gate 4, for example, then depletes the highly doped semiconductor of carriers and switches the depletion region 21 into the normal resistive state. This phase transition is believed to be a consequence of the fact that the existence of the superconducting state in semiconductors depends critically on high carrier concentration, this being true for electrons as well as for holes. The depletion region formed by gate 4 can be extended to insulation 7 to pinch off the flow of super current from source 2 to drain 3. Also, bias can be applied to gate 5 to form a second depletion region 22 as shown in FIGURE 2. When the two depletion regions meet, the flow of super current from source 2 to drain 3 is pinched off by a region of normal conductivity. Because of the insulation 6 below gate 4, the field effect transistor has a very high input impedance. Consequently, the time constant $L/R$ is very small. This depletion mode of operation is advantageous for fast pulses of high voltage.

Alternatively, the supercurrent flowing in the semiconductor need not be entirely pinched off by the normal conductive depletion region 21. If the channel is partially depleted by a potential applied at gate 4, gate 5 can be operated in a second manner to achieve rapid switching with high gain. Gate 5 can carry a supercurrent, the magnetic field of which switches the remaining part of the superconducting semiconductor to the normal state. The effect of the current in gate 5 is thus similar to the effect of the driving current in a cryotron.

Figure 3:
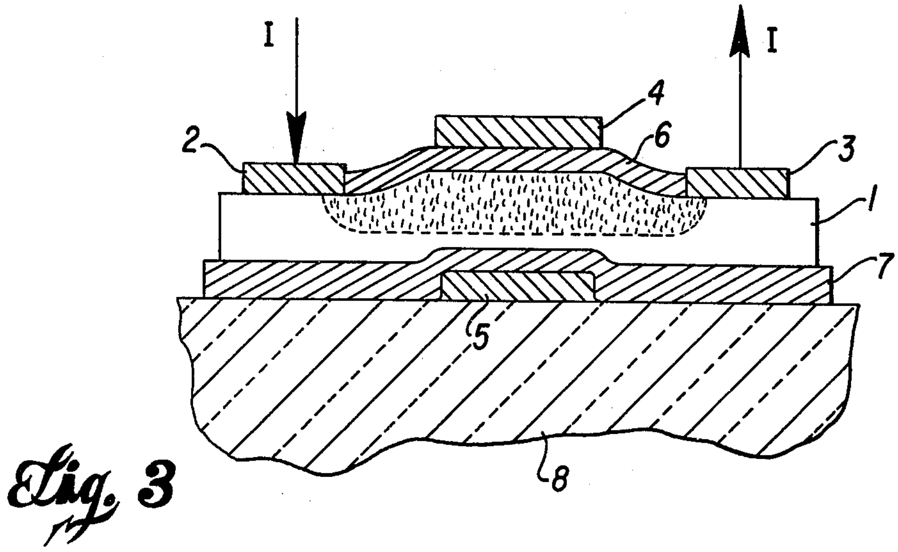
FIGURE 3 depicts the enhancement mode of operation for the device illustrated in FIGURE 1.

For operation in the enhancement mode (see FIGURE 3), the superconductive semiconductor material 1 is doped at a concentration of carriers such that it is not superconducting when a potential is applied between source and drain without bias on either gate 4 or 5. A channel connecting source 2 and drain 3 will become superconducting when an appropriate bias is applied to one of the gates. If, for example, bias is applied to gate 4 such that the carrier concentration in the semiconductor opposite gate 4 is enhanced, then this part of the semiconductor becomes superconducting.

In the fabrication of the device shown in FIGURE 1, a metallic gate 5 is deposited first on an insulating substrate 8 such as glass, followed by the insulation layer 7 and the superconductive semiconductor 1 thereupon. The depositions of the metallic layers 2 and 3, the insulating layer 6 therebetween and the metallic layer 4 on top and in the middle of insulation 6, conclude the fabrication.

Figure 4:
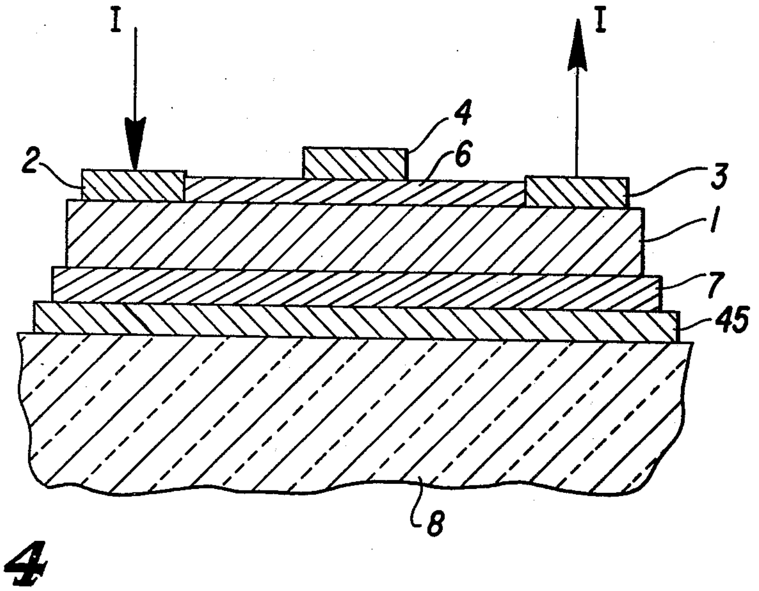
FIGURE 4 represents a modification of the structure shown in FIGURE 1.

FIGURE 4 represents a slight modification of the basic structure shown in FIGURE 1. The device shown in FIGURE 4 differs in that bias is applied to the lower gate 45 which spreads over the full length underneath the semiconductor 1. This modification is particularly useful for operation in the depletion mode. A depletion region formed by gate 45 can be extended to insulation 6 to pinch off the flow of supercurrent from source 2 to drain 3. Also, bias can be applied to gate 4 to form a second depletion region. When the two depletion regions meet, the flow of supercurrent from source 2 to drain 3 is pinched off by a region of normal conductivity. Alternatively, the supercurrent flowing in the semiconductor 1 need not be entirely pinched off by the normal conductive depletion region formed by gate 45. If the channel is partially depleted by a potential applied at gate 45, a magnetic field generated by a supercurrent flowing in gate 4 switches the remaining part of the superconducting semiconductor to the normal state.

Figure 5:
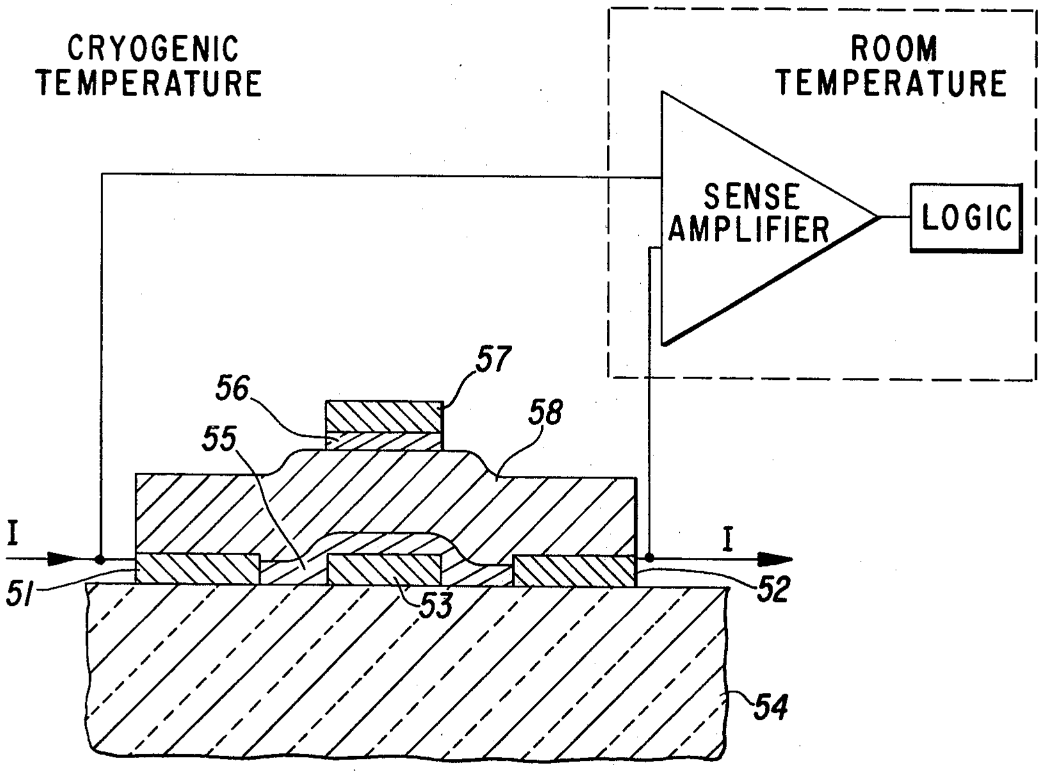
FIGURE 5 illustrates a preferred embodiment of the invention in connection with room temperature amplification and logic circuitry.

FIGURE 5 illustrates a preferred structure for the device of the invention. Metal source electrode 51 and drain electrode 52 as well as gate 53 are deposited upon an insulating substrate 54, such as glass. The gate 53 is insulated from the electrodes and the subsequently deposited superconductive semiconductor 58 by insulating film 55. A similar insulating film 56 separates gate 57 from the superconductive semiconductor 58. The structure shown in FIGURE 5 is a combination of the so-called staggered electrode structure and the coplanar electrode structure. Source 51, drain 52 and gate 57 are in the staggered electrode configuration, i.e., the metal for source and drain electrodes is deposited first upon the glass substrate 54 with a gap spacing them. The semiconductor material 58 is deposited such that it contacts the source and drain. Then, the insulating layer 56 for gate 57 is evaporated or otherwise formed around gate 53, and finally the gate 57 is put down in registry with the source-drain gap. The respective sizes and dimensions of all parts can be adjusted for speed, resistance, capacitance requirements and the like. Gate 57, for instance, may be made to overlap the source and drain slightly. The source 51, drain 52, and gate 53 electrodes in FIGURE 5 represent a coplanar electrode structure. The three electrodes are deposited upon the substrate prior to semiconductor deposition. This structure allows maximum freedom in the choice of fine pattern deposition techniques without fear of damage to the semiconductor. For contacting purposes, source 51, drain 52 and gate 53 end in metal lands outside the semiconductor layer.

In accordance with the invention, the semiconductor 58 consists preferably of a superconductive semiconductor with a high critical temperature $T_c$ such as the lead salts, more particularly the sulfides, selenides, and tellurides of lead, or intermetallic compounds like indium telluride, tin arsenide or tin antimonide. Lead telluride (PbTe) is particularly advantageous because it becomes superconductive at about 5° K. Since the boiling point of liquid helium is 4.2° K., maintenance of the temperature below the critical temperature for PbTe is no problem. Thallium is an appropriate p-type dopant for PbTe. Aluminum, gallium, titanium, tantalum, zinc, manganese or bismuth is a suitable n-type dopant for PbTe. Of course, the semiconductor layer may also comprise superconductive semiconductors with a low critical temperature like strontium titanate and germanium telluride. The metal electrodes (source 51 and drain 52) preferably consist of superconductive metal such as lead or tin. The insulating layers 55 and 56 may consist of a deposited insulator like silicon oxide, silicon dioxide, silicon nitride or photoresist; or they may be grown oxides like lead oxide.

The semiconductor layer in the thin film transistor of the invention is normally a polycrystalline layer, although single crystal layers may be capable of higher performance. The thin layers can be deposited by various heteroepitaxy techniques, e.g., evaporation or sputtering. For purposes of this invention, the sputtering technique is preferred since it avoids decomposition of the molecules, does not require separate evaporation sources, it is not necessary to heat the substrate, and all the sputtering can be carried out in one pumpdown. Typically, the metal electrodes are from about several hundred up to about several thousand angstroms in thickness; a typical thickness being 3000 A. The thickness of the insulating layer may vary between two hundred and five thousand angstroms, and the semiconductor layer from a few hundred angstroms to one or two microns. While polycrystalline layers may range in the hundreds of angstrom units, single crystalline films are preferably more than 1000 A. thick. An encapsulating overcoat consisting of a non-porous layer of a material such as silicon dioxide, silicon nitride or photoresists, can be deposited over the top of the entire structure for protection against the effects of the ambient.

In general, when devices are fabricated by evaporation, sputtering or plating techniques, the lifetime of the carriers will be short. This disadvantage may be mitigated in two ways—by using semiconductor material of extremely high mobility or by reducing device dimensions. The latter is the more feasible. In accordance with this invention, high frequency performance cryogenic field effect transistors comprising a superconductive semiconductor may be fabricated by thin film techniques in spite of reduced carrier lifetimes because the thickness of the base layer, or channel, is very small. However, since surface properties are of prime importance, care must be taken so that the surface of the layer is sufficiently free of traps in order to avoid a severe reduction of the available carriers by trapping.

Because the field effect transistor is a majority carrier device, it does not exhibit carrier storage in switching applications. The switching speed is determined entirely by the RC time constant of the gate circuitry capacitance charging through the channel resistance. With a low impedance driver and low circuit capacitance, switching times as low as a nanosecond may be attained.

The gates 53 and 57 can be replaced by heavily doped semiconductor regions establishing a polarity opposite to the polarity of the semiconductor layer 58. The function of the insulation layers 55 and 56 separating the two gates 53 and 57 from the semiconductor layer 58 is then taken over by space charge regions of reverse biased PN junctions. The width of the semiconductor area left between the space charge regions of gates 53 and 57 then determines the effective width of the channel connecting source and drain. The fabrication of such a configuration involves doping steps and epitaxial growth of semiconductor regions rather than the simple deposition of insulator and metal layers. It has not been illustrated nor described since doping and epitaxial growth are well known in the art.

An important requirement for field-effect transistors is that the mobility of the semiconductor be as high as possible for best frequency response. In addition, high mobility must be accompanied by carrier density which is not too large to be effectively modulated by the gate. However, there is an additional requirement for the device material of this invention. The microscopic (Bardeen-Cooper-Schrieffer) theory of superconductivity postulates that for material to be superconductive it must have a high density of states at the Fermi level. A way in which this can be readily accomplished is to make the carrier concentration in the material very high or even to degenerately dope the material. The carrier concentration can be made high (e.g. $10^{19}$ carriers per cm.$^3$) by adding a large amount of impurities during the formation of the layer (that is, during the sputtering or evaporation process) or by an impurity diffusion or doping after the formation of the layer.

In addition to maximization of the carrier concentration, a large density of states at the Fermi level can be achieved by the following: (a) maximization of the number of degenerate valleys; when the semiconductor material (as shown in FIGURES 1–5) is n-type, the degenerate valleys have to be in the conduction band. The lead salts, which have five degenerate valleys, are a good choice in this respect. (b) maximization of the single-valley effective mass of the carriers. With an effective electron mass between 0.1 and 0.4 electron mass, pure lead salts may be inferior to intermetallic compounds. (c) maximization of the static dielectric constant. At low temperatures, lead telluride exhibits a static dielectric constant of 400, and represents therefore an excellent material for the device of the invention. (d) maximization of the inter-valley coupling constant. For lead telluride, by way of example, a value of about 8 ev. has been determined, which is similar to the value for germanium. (e) maximization of the phonon degeneracy factor. For lead telluride, by way of example, a value of 3 has been calculated which is significantly higher than the value 2 for germanium.

Lengths and widths can be patterned so that the device of the invention is compatible with room temperature FET's as well as with cryotron arrays. The longitudinal dimensions, therefore, will preferably vary between 5 and 50 mm. For purposes of interconnecting devices of the invention among themselves and/or with cryotron memory and logic elements, the metallic layers of source, drain and gates can be tailored in the fashion of integrated circuits and extended for any desired purpose, as long as the device functions are not impeded.

If the semiconductor layer 58 is doped at a concentration of carriers such that it is superconducting when a potential is applied between source 51 and drain 52 without a bias on either gate 53 or 57, a voltage applied to gate 57, by way of example, depletes the layer 58 of carriers and switches the depletion region into the normal resistive state. The depletion region formed by gate 57 can be extended to insulation 55 to pinch off the flow of supercurrent from source 51 to drain 52. Also, bias can be applied to gate 53 to form a second depletion region. When the two depletion regions meet, the flow of supercurrent from source 51 to drain 52 is likewise pinched off by a region of normal conductivity. Alternatively, the supercurrent flowing in the semiconductor 58 need not be entirely pinched off by the normal conductive depletion region formed by gate 57. If the channel is partially depleted by a potential applied at gate 57, a magnetic field generated by a supercurrent flowing in gate 53 switches the remaining part of the superconducting semiconductor 58 to the normal state.

The cryogenic device of the invention depicted in FIGURE 5 is shown connected to conventional room temperature sense amplification and logic circuitry. Typically, the cryogenic device depicted in FIGURE 5 is connected to or made a part of a cryogenic memory element or logic module. For example, the gate 53 is made a part of one state of a cryotron memory loop, and the device is statically biased in the depletion mode by means of gate 57, as described above. If the gate 53 is part of the loop representing the "1" state, for example, when the loop is switched to that state, the supercurrent which then flows in gate 53 switches the remaining part of the superconducting semiconductor 58 to the normal state. This sudden increase in resistance causes a signal to appear between source 51 and drain 52 which is then utilized by the room temperature circuitry.

It should also be apparent that the device shown in FIGURE 5 can be used in either the depletion or enhancement modes as an amplifier or current modulator. A large current flowing between source 51 and drain 52 can be modulated in the depletion mode by a relatively small bias current flowing in either gate 57 or both 53 and 57, as described above, and in the enhancement mode by a relatively small bias current at gate 53 which forms a channel of varying width connecting source 51 and drain 52.

It will be understood by those skilled in the art that the above are but a few of the many possible specific applications of a device of the invention. Characteristics and applications of room temperature field effect transistors are well known, e.g., see Leonce J. Sevin, Jr., Field Effect Transistors, Texas Instruments Electronics Series, McGraw-Hill Book Company (New York 1965). These applications include use in low level linear circuits, nonlinear circuits and integrated circuits. The importance of the device of the invention lies in the fact that the range of all these applications, particularly amplification functions in integrated circuits, is now extended to cryogenic temperatures. This feature will be particularly helpful in cryogenic logic and memory applications since the drawbacks encountered in room temperature amplification are substantially eliminated.

The devices of the invention operate in the superconductive state and thus utilize the inherent advantages of a superconductor: no power dissipation and fast operation. These attributes in themselves make the devices unique among FET's. In addition, the devices will have a strong impact on the design and operation of superconductive memories and logic (in particular, cryotrons), since they allow signal amplification at cryogenic temperatures and thus simplify the temperature circuitry. Simplification of amplification (AC or DC) is possible since a considerable voltage appears between source and drain when the device is switched to the normal state. In conventional cryotron circuits, on the other hand, the signal generated when a portion of the loop (usually of tin metal) is switched to normal state, is only about 10 microvolts. The voltage drop between source and drain in the device of the invention is about 1 millivolt. This enhanced voltage output is advantageous from several circuit design aspects. First, the substantially greater signal produced by a device of the invention can be further amplified at cryogenic temperatures by devices having a similar configuration. Second, when a device of the invention is employed as a sense amplifier, it remains in the superconducting state when not operating and thus dissipates no power. Third, the room temperature sense amplified (see FIGURE 5) can be a low gain amplifier rather than a high gain amplifier. Fourth, this amplifier has to fulfill less stringent noise requirements than present amplifiers.

What is claimed is:

1. A cryogenic field-effect device operable in both depletion and enhancement modes of operation, comprising:

(a) a layer of superconductive semiconductor material forming a channel and connecting metallic source and drain electrodes, (b) a first gate electrode for applying an electric field through said channel overlying and electrically insulated from said layer of semiconductor material and in spaced relation to said source and drain electrodes, and (c) a second gate electrode opposite said first gate electrode and electrically insulated from said layer of semiconductor material, (d) and means for providing current flow in said second gate electrode to cause a magnetic field to be applied to said channel.

2. The device according to claim 1 wherein said superconductive semiconductor material is a lead salt.

3. The device according to claim 1 wherein said superconductive semiconductor material is lead telluride (PbTe).

4. The device according to claim 1 including biasing means connected across one of said gate electrodes for depleting a channel region formed in said semiconductor material when a potential is applied between source and drain.

5. The device according to claim 1 including biasing means connected across one of said gate electrodes for forming a superconducting channel in said semiconductor material between said source and drain.

References Cited

UNITED STATES PATENTS

| | | | |
|---|---|---|---|
| 3,258,663 | 6/1966 | Weimer | 317—235 |
| 3,384,794 | 5/1968 | Boyle et al. | 317—235 |
| 3,405,331 | 10/1968 | Skalski, et al. | 317—235 |

JERRY D. CRAIG, Primary Examiner.

U.S. Cl. X.R.

307—245, 306